(12) United States Patent
Kadosh

(10) Patent No.: US 8,180,958 B2
(45) Date of Patent: May 15, 2012

(54) KEY SELECTION DEVICE AND PROCESS FOR CONTENT-ADDRESSABLE MEMORY

(75) Inventor: Aviran Kadosh, Misgav (IL)

(73) Assignee: Marvell Israel (MISL) Ltd. (IL)

( * ) Notice: Subject to any disclaimer, the term of this patent is extended or adjusted under 35 U.S.C. 154(b) by 582 days.

(21) Appl. No.: 12/105,716

(22) Filed: Apr. 18, 2008

(65) Prior Publication Data

US 2008/0263269 A1 Oct. 23, 2008

Related U.S. Application Data

(60) Provisional application No. 60/912,569, filed on Apr. 18, 2007.

(51) Int. Cl.
*G06F 12/00* (2006.01)
*G06F 13/00* (2006.01)
*G06F 13/28* (2006.01)

(52) U.S. Cl. ........................................................ 711/108

(58) Field of Classification Search .................... 711/108
See application file for complete search history.

(56) References Cited

U.S. PATENT DOCUMENTS

| 4,739,308 | A  | * | 4/1988  | Lienard        | 341/67  |
|-----------|----|---|---------|----------------|---------|
| 7,099,426 | B1 | * | 8/2006  | Cory et al.    | 375/372 |
| 7,433,980 | B1 | * | 10/2008 | Fischaber et al.| 710/65 |
| 2004/0003170 | A1 | * | 1/2004 | Gibson et al.  | 711/108 |

* cited by examiner

*Primary Examiner* — Kevin Ellis
*Assistant Examiner* — Chad Davidson

(57) ABSTRACT

A method and a computer readable medium having executable instructions are provided. The method and instructions when executed generates a first look-up key from a group of look-up key units stored in a data storage, generation of the first look up key being completed prior to the completion of a key generation processing cycle. A next look-up key unit from the group of look-up key units stored in the data storage may be skipped over when the next look up key corresponds to a second look-up key that has a key length equal to or smaller than a predetermined key length. A third look-up key unit may be selected from the group of look-up key units, the third look-up key unit associated with a third look-up key having a key length greater than a second predetermined key length, the second predetermined key length being greater than the first predetermined key length. The first look-up key and a portion of the third look-up key sequentially may be output during the same output processing cycle.

20 Claims, 8 Drawing Sheets

| Line No. | Address | Output Port |
|---|---|---|
| 1 | 101XX··· | A |
| 2 | 0110X··· | B |
| 3 | 011XX··· | C |
| 4 | 10011··· | D |
| ⋮ | ⋮ | ⋮ |

Fig. 1

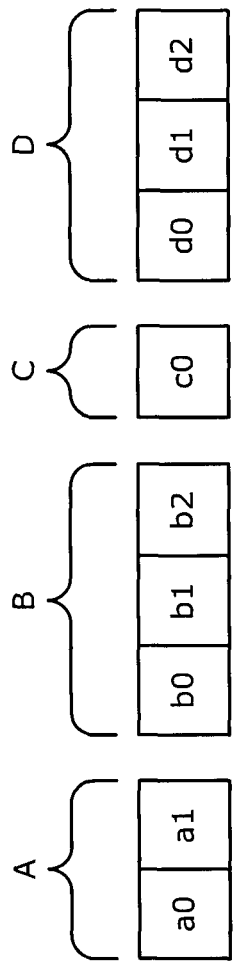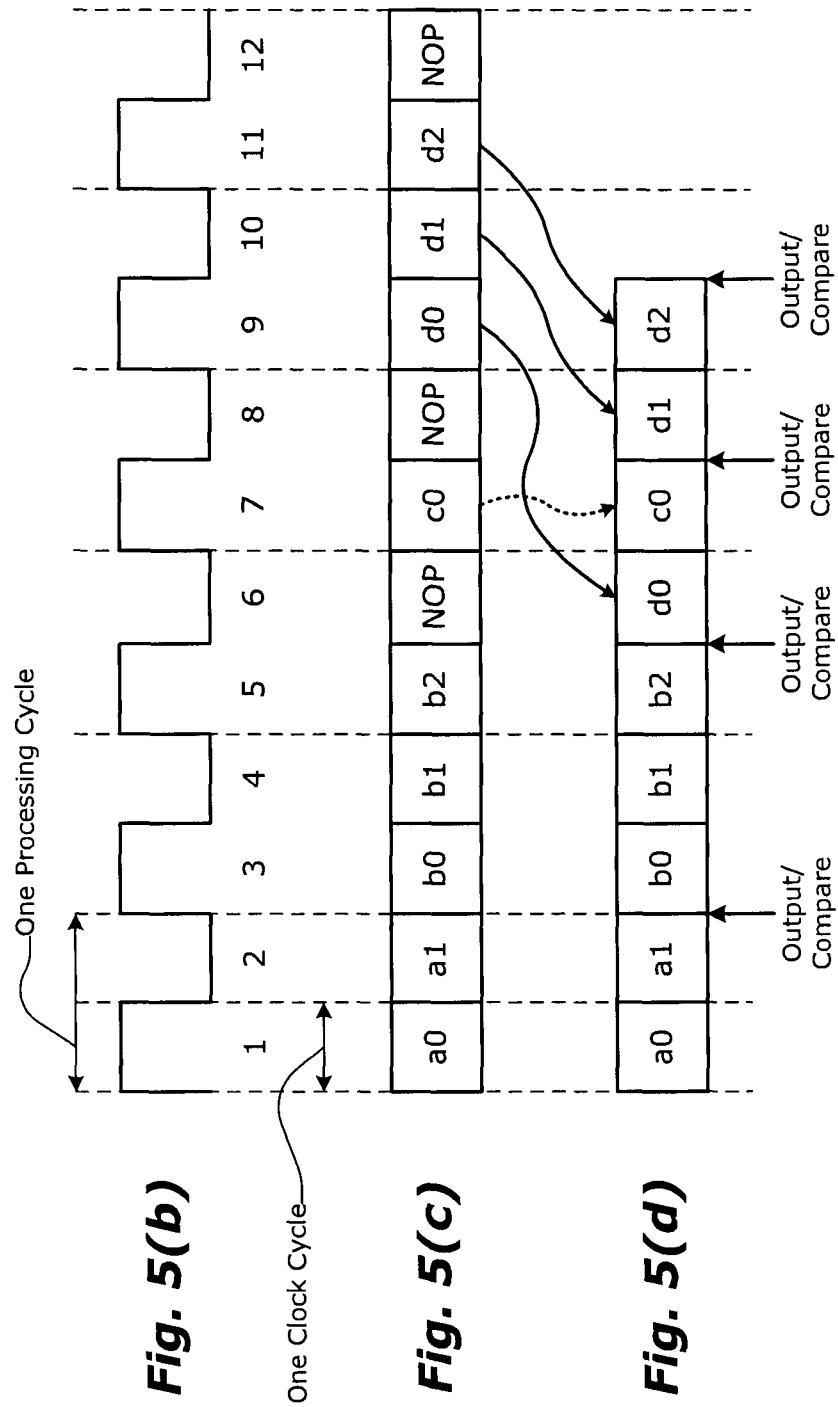
Fig. 5(a)
Fig. 5(b) One Clock Cycle
Fig. 5(c)
Fig. 5(d)

KEY SELECTION DEVICE AND PROCESS FOR CONTENT-ADDRESSABLE MEMORY

CROSS REFERENCE TO PRIOR APPLICATIONS

This application claims priority and the benefit thereof from U.S. Provisional Patent Application Ser. No. 60/912,569 filed on Apr. 18, 2007, which is hereby incorporated by reference for all purposes as if fully set forth herein.

BACKGROUND

1. Field of the Disclosure

This disclosure is directed to content-addressable memories (CAM), and particularly to optimization of a CAM request interface used in conjunction with a CAM.

2. Related Art

A content-addressable memory (CAM) is a hardware search engine that is suitable for some search-intensive applications. A CAM is typically composed of semiconductor memory with added comparison circuitry that enables a search operation, for example, whether a particular value is present in the memory, to complete in a single clock cycle. Two most common search-intensive tasks that use a CAM are packet forwarding and packet classification operations in Internet routers.

There are two basic forms of CAM: binary and ternary. Binary CAMs support storage and searching of binary bits, zero (0) or one (1). Ternary CAMs (TCAMs) support storing of zero (0), one (1) or a don't care bit (X). TCAMs are presently the dominant CAM in Internet routers because longest-prefix routing is the Internet standard.

Commercially available TCAM devices, such as, for example, NL6000 and NL7000 series TCAMs from Netlogic Microsystem™, deliver reasonable performance and reliability for packet forwarding and packet classification for current Internet routers. However, existing TCAMs may not deliver satisfactory performance for packet forwarding and packet classification for some applications. For example, variable key sizes (namely values to be searched in a TCAM) may not be efficiently handled by the TCAM, resulting in no operation being performed during some time periods when variable length keys are used.

Accordingly, there is a need for an increased packet forwarding speed, increased packet classification speed and/or increased capability for Internet routers.

SUMMARY OF THE DISCLOSURE

In one aspect, a method for optimizing generation of look-up keys for searching is provided. The method includes generating a first look-up key from a group of look-up key units stored in a data storage, generation of the first look-up key being completed prior to the completion of a key generation processing cycle, skipping over a next look-up key unit from the group of look-up key units stored in the data storage when the next look up key unit corresponds to a second look-up key that has a key length equal to or smaller than a first predetermined key length, selecting a third look-up key unit from the group of look-up key units, the third look-up key unit being associated with a third look-up key having a key length greater than a second predetermined key length, the second predetermined key length being greater than the first predetermined key length, and outputting the first look-up key and a portion of the third look-up key sequentially during the same output processing cycle.

In another aspect, a computer readable medium having a stored computer program embodying instructions, which, when executed by a computer, cause the computer to optimize generation of look-up keys for searching, is provided. The computer readable medium includes instructions for generating a first look-up key from a group of look-up key units stored in a data storage, generation of the first look-up key being completed prior to the completion of a key generation processing cycle, instructions for skipping over a next look-up key unit from the group of look-up key units stored in the data storage when the next look up key unit corresponds to a second look-up key that has a key length equal to or smaller than a first predetermined key length, instructions for selecting a third look-up key unit from the group of look-up key units, the third look-up key unit being associated with a third look-up key having a key length greater than a second predetermined key length, the second predetermined key length being greater than the first predetermined key length, and instructions for outputting the first look-up key and a portion of the third look-up key sequentially during the same output processing cycle.

Additional features, advantages, and embodiments of the disclosure may be set forth or apparent from consideration of the following detailed description, drawings, and claims. Moreover, it is to be understood that both the foregoing summary of the disclosure and the following detailed description are illustrative and intended to provide further explanation without limiting the scope of the disclosure as claimed.

BRIEF DESCRIPTION OF THE DRAWINGS

The accompanying drawings, which are included to provide a further understanding of the disclosure, are incorporated in and constitute a part of this specification, illustrate embodiments of the disclosure and together with the detailed description serve to explain the principles of the disclosure. No attempt is made to show structural details of the disclosure in more detail than may be necessary for a fundamental understanding of the disclosure and the various ways in which it may be practiced. In the drawings:

FIG. 1 illustrates a routing table for an address lookup function of an Internet router that may be used with a device and process in accordance with an embodiment of the disclosure;

FIG. 5(a) shows various keys having different key lengths;

FIG. 5(b) shows a clock cycle diagram for key output processing operations;

FIG. 5(c) shows a key selection processing sequence;

FIG. 5(d) shows a key selection processing sequence according to the key selection arbitration scheme in accordance with an embodiment of the disclosure.

DETAILED DESCRIPTION

Figure 2:
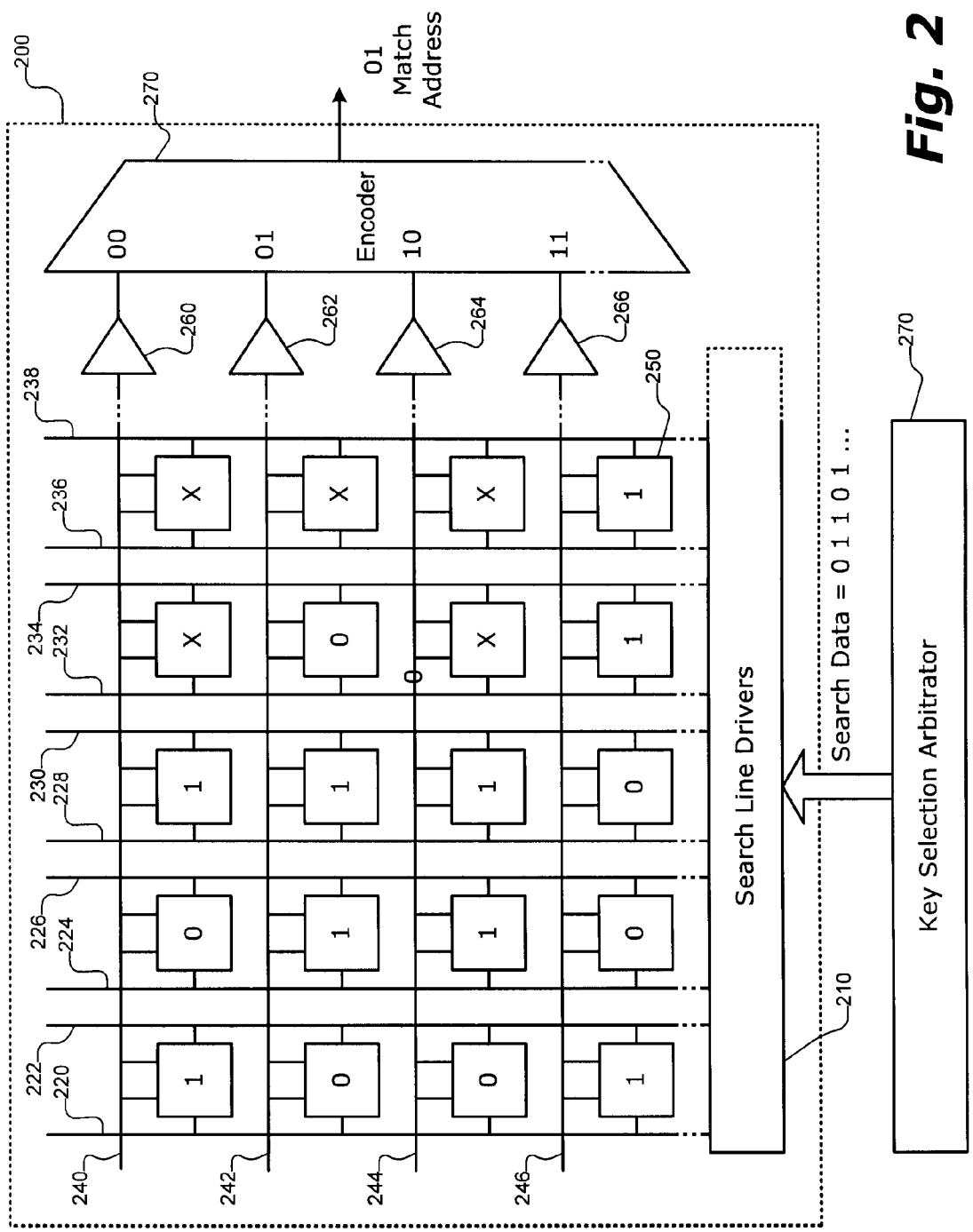
FIG. 2 shows a TCAM and a key selection arbitrator for optimizing a key selection process for the TCAM in accordance with an embodiment of the disclosure.

The embodiments of the disclosure and the various features and advantageous details thereof are explained more fully with reference to the non-limiting embodiments and examples that are described and/or illustrated in the accompanying drawings and detailed in the following description. It should be noted that the features illustrated in the drawings are not necessarily drawn to scale, and features of one embodiment may be employed with other embodiments as the skilled artisan would recognize, even if not explicitly stated herein. Descriptions of well-known components and processing techniques may be omitted so as to not unnecessarily obscure the embodiments of the disclosure. The examples used herein are intended merely to facilitate an understanding of ways in which the disclosure may be practiced and to further enable those of skill in the art to practice the embodiments of the disclosure. Accordingly, the examples and embodiments herein should not be construed as limiting the scope of the disclosure, which is defined solely by the appended claims and applicable law. Moreover, it is noted that like reference numerals represent similar parts throughout the several views of the drawings.

During operation, an Internet router may forward data packets from an incoming port using an address lookup function. The address lookup function examines the packet's destination address and may choose an output port associated with that address. The router's list of destination addresses and their corresponding output ports may be called the routing table. An example of a portion of a simplified routing table is shown in FIG. 1. Some entries in the table of FIG. 1 include a don't care bit X, matching both a 0 and a 1 in that position. Because of the X bits, the first three entries in the table represent a range of input addresses. For example, the entry on Line 1 indicates that all addresses in the range of 10100 . . . to 10111 . . . are forwarded to Output Port A. The router may search for the destination address of each incoming packet in the address lookup table to find the appropriate output port. For example, if the router receives a packet with the incoming address 01101 . . . , the address lookup matches both Line 2 and Line 3 in the table, and Line 2 may be selected because this line has the most defined bits, indicating it may be the most direct route to the destination. This lookup process may be referred to as longest-prefix matching and may be required to implement the most recent Internet Protocol (IP) networking standard.

The routing parameters that may determine the complexity of the implementation include an entry size, a table size, a search rate, and a table update rate. Present IPv4 addresses are 32 bits long and the proposed IPv6 addresses are 128 bits long. Ancillary information like the source address and quality-of-service (QoS) information can balloon IPv6 routing table entry sizes from 288 to 576 bits. Currently, routing table sizes typically include about 30,000 entries but are growing rapidly. Terabit-class routers must perform hundreds of millions of searches per second in addition to thousands of routing table updates per second. It is noted that the table and addresses of FIG. 1 are merely examples and that the device and process may use any suitable form of tables and addresses.

FIG. 2 shows a key selection arbitrator 270 configured to optimize a key selection process for a TCAM 200 in accordance with an embodiment of the disclosure. The key selection arbitrator 270 may be configured such that the same number of keys may be provided to the TCAM 200 in a shorter period of time, fewer clock cycles, compared to the conventional key selection process as described below in detail.

It is noted that only a portion of the TCAM 200 is shown. To illustrate how the TCAM 200 may implement address lookup, it may be assumed that the TCAM 200 contains data associated with the routing table from FIG. 1. Data associated with larger or smaller tables is contemplated. The TCAM 200 may be configured with search line drivers 210, search lines 220, 222, 224, 226, 228, 230, 232, 234, 236, 238, match lines 240, 242, 244, 246, core cells 250 (only one of the core cells is referenced), match line sense amps 260, 262, 264, 266 and an encoder 270. The search line drivers 210 may be configured to receive a search data input (e.g., a key) from a key selection arbitrator 270 and provide the search data to the core cells 250 through the search lines 220, 222, 224, 226, 228, 230, 232, 234, 236, 238. The core cells 250 may be arranged into the shown horizontal words. The core cells 250 may contain both storage and comparison circuitry in order to compare whether the search line from the search line drivers 210 matches any of the horizontal words. The matchline 240 may be configured to indicate whether the search data matches the row's word. An activated matchline may indicate a match and a deactivated matchline indicates a non-match, called a mismatch. The activated matchlines may be input to the encoder 270 that may generate the address corresponding to the match location.

Figure 3:
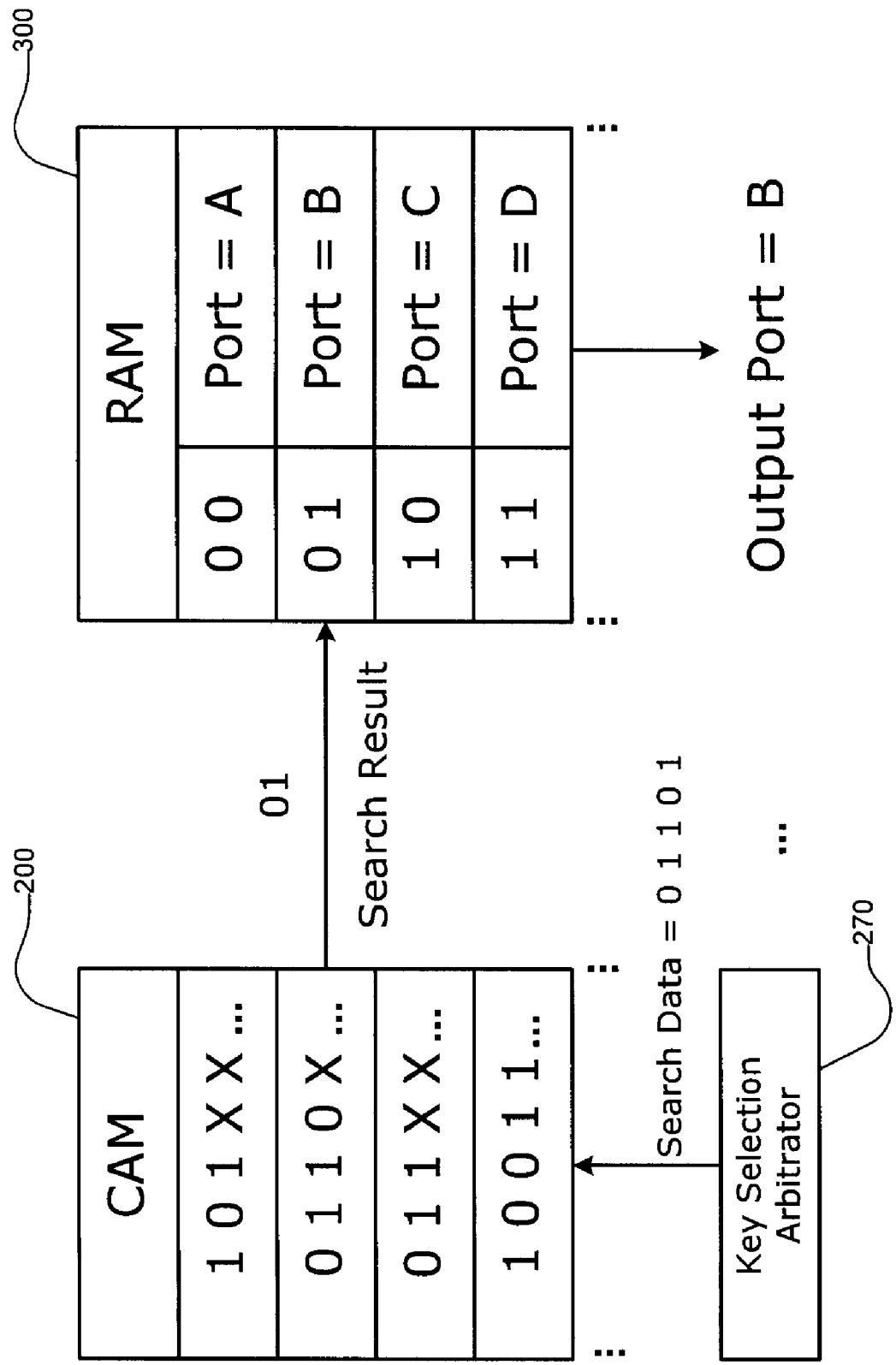
FIG. 3 shows a block diagram of the TCAM of FIG. 2 and a random access memory (RAM) that may be used with a device and process in accordance with an embodiment of the disclosure.

In operation, initially all matchlines 240, 242, 244, 246 may be precharged high, putting them all temporarily in the match state. Next, the search line drivers 210 may broadcast the search data, for example, 01101 as shown in FIG. 2, onto the search lines 220, 222, 224, 226, 228, 230, 232, 234, 236, 238. Then each CAM core cell 250 may compare its stored bit against the bit on its corresponding search lines 220, 222, 224, 226, 228, 230, 232, 234, 236, 238. Cells with matching data may not affect the matchline, but cells with a mismatch may pull down the matchline. Cells storing an X may operate as if a match has occurred. The aggregate result is that matchlines may be pulled down for any word that has at least one mismatch. All other matchlines remain activated (precharged high). In FIG. 2, the two middle matchlines 242, 244 remain activated, indicating a match, while the other matchlines 240, 246 discharge to ground, indicating a mismatch Finally, the encoder 270 may generate the search address location of the matching data. In the example, the encoder 270 may select numerically the smallest numbered matchline of the two activated matchlines 242, 244, generating the match address 01. This match address may be used as the input address to a RAM that contains a list of output ports as depicted in FIG. 3. This CAM/RAM system may be a complete implementation of an address lookup engine. The match address output of the CAM 200 may be in fact a pointer used to retrieve associated data from the RAM 300 shown in FIG. 3. In this case, the associated data may be the output port. The CAM/RAM search may be viewed as a dictionary lookup where the search data is the word to be queried and the RAM 300 contains the word definitions.

Figure 4:
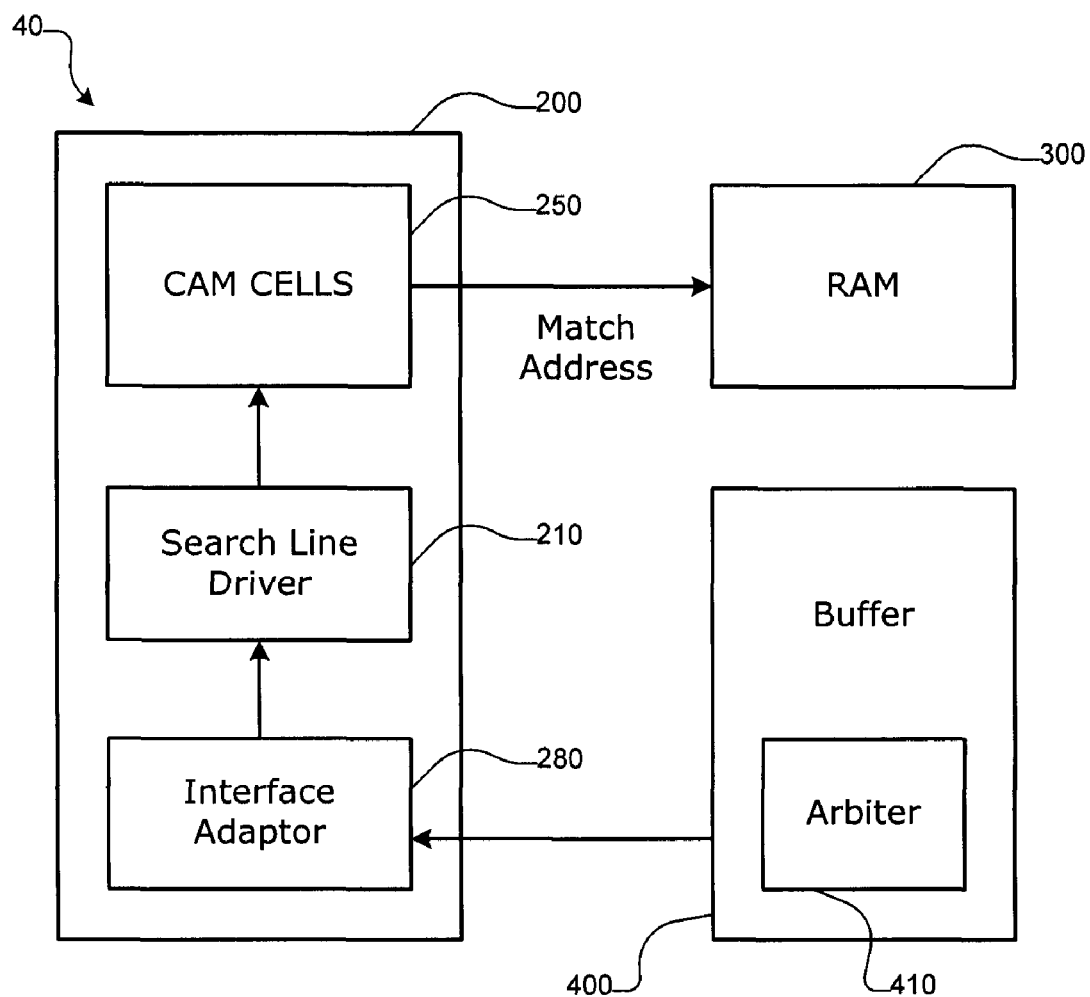
FIG. 4 shows a structural overview of a system implemented with a key selection arbitration scheme operated according to an embodiment of the disclosure.

FIG. 4 shows a structural overview of a system 40 implemented with a key selection arbitration arrangement in accordance with an embodiment of the disclosure. The arrangement may include a content-addressable memory (CAM) 200, a random access memory (RAM) 300 and a buffer 400. The CAM 200 may include a search line driver 210, a plurality of CAM cells 250 and an interface adaptor 280, but other arrangements are contemplated. The buffer 400 may include an arbiter 410, which may be configured to select keys stored in the buffer 400 and provide the selected keys to the interface adaptor 280 of the CAM 200. However, it is noted that the arrangement of the system 40 may be configured with different elements and arrangements without departing from the scope and/or spirit of the disclosure. For example, the arbiter 410 may be provided externally to the buffer 400 or integrated in the CAM 200. The interface adaptor 280 may forward the keys provided from the buffer 400 to the search line driver 210 in order to search the match lines in the CAM cell 250, as explained above with reference to FIGS. 1, 2 and 3 or using a different process.

In accordance with an embodiment of the disclosure, the arbiter 410 may be configured to optimize a key selection process such that the same amount of keys may be provided to the CAM 200 in a shorter period of time, fewer clock cycles, compared to the conventional key selection process, as will be explained with reference to FIGS. 5(a), 5(b), 5(c) and 5(d).

FIG. 5(a) shows four keys A, B, C and D, which may be stored in the buffer 400 and grouped together before being forwarded to the CAM 200. The keys A, B, C and D may vary in their key lengths, and may be divided into more than one key unit. A key unit may have a predetermined key length, for example, 72 bits. For illustration purposes, key A may have a key length greater than 72 bits but equal to or smaller than 144 bits, and hence may be divided into two key units a0, a1. Key B may have a key length greater than 144 bits but equal to or smaller than 216 bits, and hence may be divided into three key units b0, b1, b2. Key C may have a key length equal to or smaller than 72 bits and hence include one key unit c0. Similar to key B, key D may have a key length greater 144 than bits but equal to or smaller than 216 bits, and hence may be divided into three key units d0, d1, d2. Although specific values are listed, any number of keys, key lengths and key units are contemplated in this disclosure.

FIG. 5(b) shows a clock cycle diagram for the key selection process, where a single key selection processing cycle may have two clock cycles. The buffer 400 may be configured to select one key unit per clock cycle. In the conventional key selection process, only one key may be processed during a processing cycle. For example, FIG. 5(c) shows a key selection processing sequence to illustrate how keys A, B, C, D of FIG. 5(a) are selected to be forwarded to the CAM 200 under the conventional key selection process. The two key units a0, a1 of key A are processed in the first and second clock cycles, thereby completing the key selection process within the first key selection processing cycle. Then the three key units b0, b1, b2 of the key B are processed in the next three clock cycles (i.e., third, fourth and fifth overall clock cycles). While the processing of the first two key units b0, b1 of key B is completed in the first and second clock cycles (i.e., third and fourth overall clock cycles) of the second key selection processing cycle, the third key unit b2 is processed in the first clock cycle (i.e., fifth overall clock cycle) of the third key selection processing cycle.

When the key selection process does not process two different keys in the same key selection processing cycle, no operation (also known as "NOP") may be performed in the second clock cycle (i.e., sixth overall clock cycle) of the third key selection processing cycle. The processing of the next key C starts on the fourth processing cycle (i.e., seventh overall clock cycle). Since key C includes only one key unit c0, the key unit c0 may be processed in the first clock cycle (i.e., seventh overall clock cycle) of the fourth processing cycle and no operation may have to be performed (NOP) in the second clock cycle (i.e., eighth overall clock cycle) of the fourth processing cycle. The processing of the next key D starts on the fifth processing cycle (i.e., ninth overall clock cycle). Similar to the processing of key B, the first two key units d0, d1 may be processed during the first and second clock cycles (i.e., ninth and tenth overall clock cycle) of the fifth processing cycle and the last key unit d2 may be processed in the first clock cycle (i.e., eleventh overall clock cycle) of the sixth processing cycle. Again, no operation (NOP) may be performed on the second clock cycle of the sixth processing cycle (i.e., twelfth overall clock cycle). Thus, according to the conventional key selection scheme, three clock cycles are wasted for the NOP, which is 25% of the entire twelve clock cycles in the particular example shown in FIG. 5(c).

To address this shortcoming, in accordance with an embodiment of the disclosure, the arbiter 410 may process the grouped keys A, B, C and D such that at least one of the NOP clock cycles may be recycled to process a key unit of the subsequent key when certain conditions are met.

Thus, in an embodiment of the disclosure, the certain conditions may include when one key and a portion of the next key may be processed in a single key selection processing cycle. For example, when the first one of two sequential keys is equal to or shorter than a single unit key and the second key is longer than twice the single key unit. For example, the first key may have a single key unit and the second key may have at least three key units. When these conditions are met, upon completing processing of the first key in the first clock cycle of the key selection processing cycle, one of the at least three key units of the second key may be processed in the second clock cycle of the same key selection processing cycle, which would have been an NOP clock cycle. However, other criteria may control the conditions and are accordingly contemplated in this disclosure.

FIG. 5(d) shows an example of a key selection processing sequence for recycling an NOP clock cycle, operated in accordance with an embodiment of the disclosure. Keys A and B have more than two key units and hence may not trigger the NOP clock cycle recycling process in the first, second and third key selection processing cycles. The arbiter 410 may not perform two compare operations on consecutive clock cycles because insertion of a single unit key may require comparing of consecutive cycles. Instead, a first part of a long key may be inserted to recycle a NOP clock cycle. Thus, in FIG. 5(d), no NOP may be required in the second clock cycle (i.e., sixth overall clock cycle) of the third processing cycle. When the arbiter 410 recognizes that key C is a short key that is to be sent, it may select a long key D and send its first key unit D0 in the second clock cycle (i.e., sixth overall clock cycle) of the third processing cycle. Then, the key C0 may be sent on the 7th clock cycle and then keys D1 and D2 in the eighth and ninth clock cycles. This approach saves, in this example, 2 cycles out of 11 cycles.

Then, the arbiter 410 may further process the remaining key units d1, d2 of key D in the fifth key selection processing cycle, which enables processing of the next key (not shown) in the sixth key selection processing cycle. Accordingly, the disclosure may enable the same amount of keys to be processed in a shorter period of time, using, for example, fewer clock cycles, compared to the conventional key selection process.

Figure 6A:
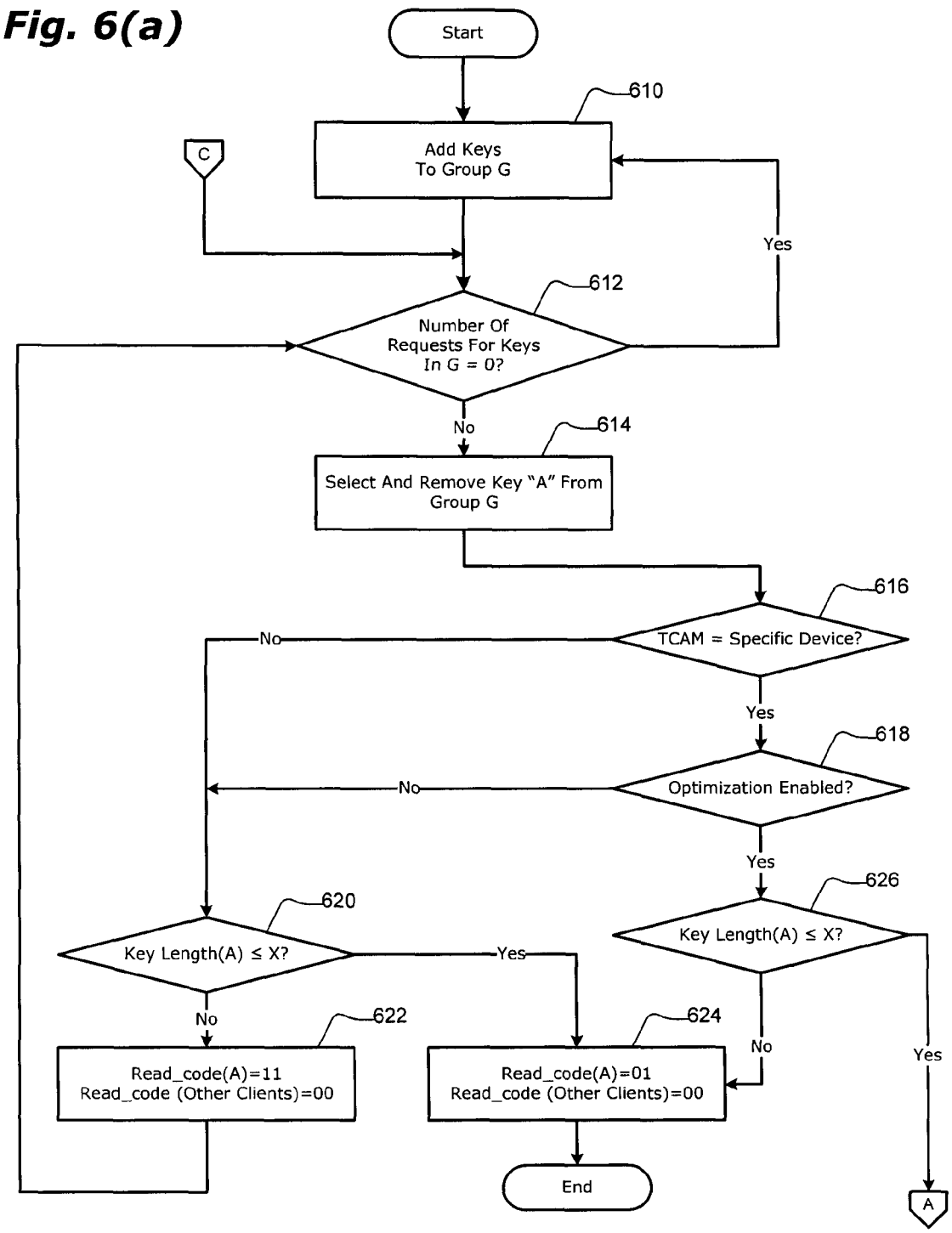
FIGS. 6(a), 6(b) and 6(c), respectively show a portion of a flow chart for a key selection arbitration scheme operating in accordance with an embodiment of the disclosure.
Figure 6B:
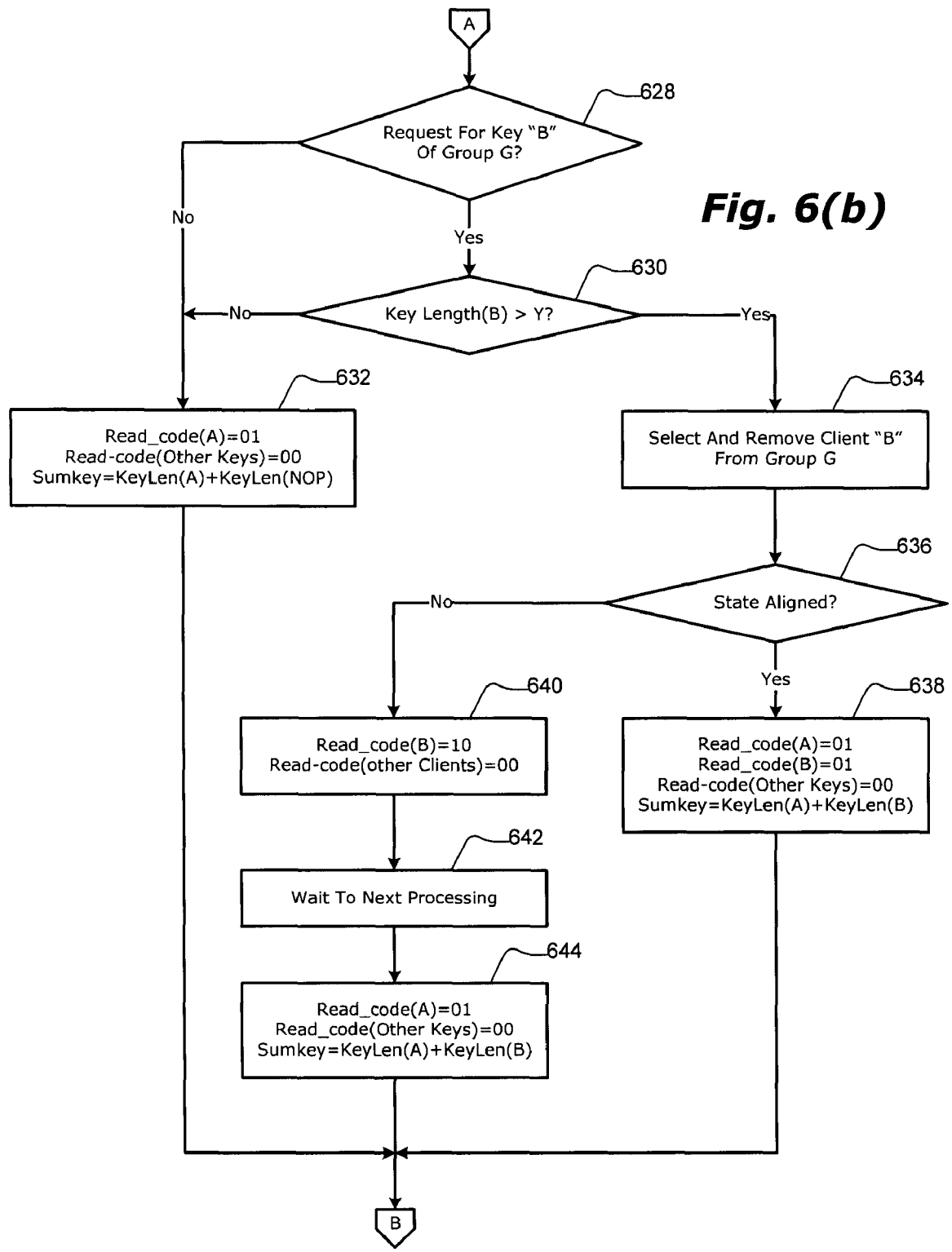
Figure 6C:
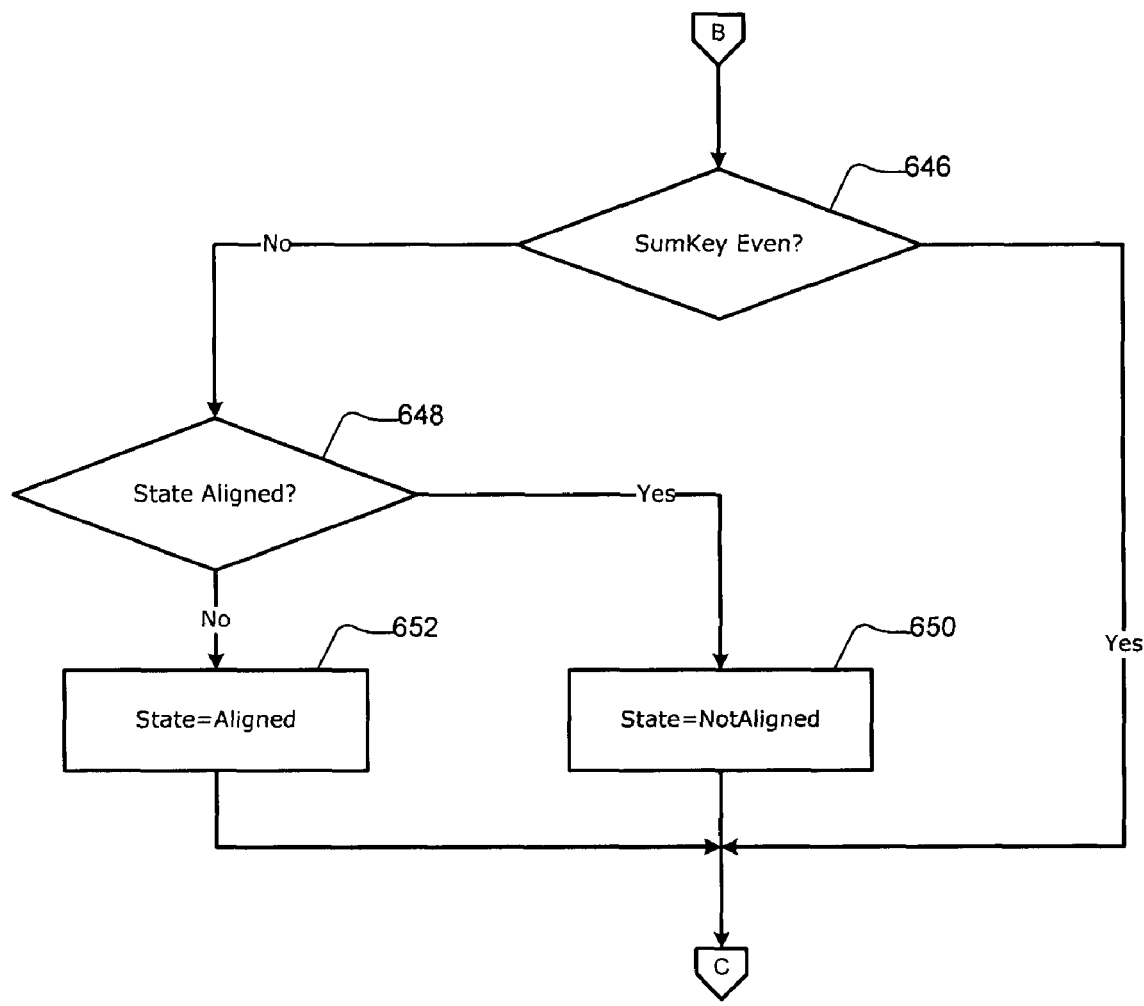

FIGS. 6(a), 6(b) and 6(c) respectively each show a portion of a flow chart for the key selection arbitration process operating according to an embodiment of the disclosure. In FIG. 6(a), upon starting the process, keys stored in the buffers may be added to a group G at 610. When the number of requests is zero at 612, the process moves back to 610 to add keys to group G at 610. Otherwise, key A is selected and removed from group G at 614.

Subsequently, several steps may be performed to determine whether certain conditions are met for a NOP clock cycle recycling process. For example, it may be determined whether a specific CAM device, that may be configured for NOP recycling (e.g., NL6000 or NL7000 TCAM series), is detected or not at 616. This may be necessary if software codes for the key selection arbitration process have been written for a specific CAM device. Also, it may be determined whether, for example, the recycling of NOP clock cycles has been enabled at 618.

When those conditions are not met at 616, 618, the process may move to 620 where it may be determined whether key A is equal to or shorter than a predetermined key length X. In an embodiment, the predetermined key length X may be a single key unit length (e.g., 72 bits long) as mentioned above. Other key unit lengths are contemplated. When the key length of key A is longer than X bits, at 622, the key units of key A are selected (i.e., read_code(A)=11) for sequential readout to the TCAM 200 while no other keys are selected for readout (i.e., read_code(Other Keys)=00). Upon completing 622, the process may move back to 612 to determine whether the number of requests is zero or not. If it is determined that the key length of key A is equal to or shorter than the predetermined key length X at 620, it may be determined that there is only one key unit and the key unit may be selected for readout (i.e., read_code(A)=01) at 624, and the process may end upon completion of 624.

When the conditions are met at 616, 618, the process may move to 626 where it may be determined whether the key length of key A is equal to or shorter than the predetermined key length X. If this condition is not met, the process may move to 624 to select the key units of key A for sequential readout while no other keys are selected for readout. If the condition is met, the process may move to 628 shown in FIG. 6(*b*).

Upon determining that key A is equal to or shorter than the single key unit length, at 628, it may be determined whether there is a request for key B, which may be in the same group G with key A. When there is a request, it may be determined whether key B is longer than another predetermined key length Y at 630. The predetermined key length may be two key units long (i.e., 144 bits long). If these conditions are not met at 628, 630, it may be determined that it is not necessary to perform recycling of NOP clock cycles and key A may be selected for readout (i.e., read_code(A)=01) and no other keys may be selected for readout (i.e., read_code(Other Keys) =00) at 632. Furthermore, a determination of the value Sumkey=Keylen(A)+Keylen(NOP) operation may be determined at 632. The function Keylen(x) may be the number of key units in a key x. This calculation may be used to check the arbiter state of: aligned; or not aligned. The alignment may be important since according to an implementation in each clock cycle, two clock units may be processed and it may be required to know if an interface is aligned to the processing cycle (FIG. 5*b*) and the two key units may be sent at the same clock cycle or not and only one may be sent in this processing cycle and the second may be sent on the first slot of next processing cycle.

When the conditions are met at 628, 630, the process may move to 634 where key B may be selected and removed from group G. With key A having a single key unit and key B having at least three key units, it may be determined whether the key selection processing cycle is aligned or not at 636. The term "aligned" indicates that the processing of key A may start on the first clock cycle of a key selection processing cycle. For example, in FIG. 5(*d*), the key unit c0 of key C may be processed in the first clock cycle of the fourth key selection processing cycle, thereby making the fourth key selection processing cycle "aligned."

Upon determining that the current key selection processing cycle is aligned, key A may be selected for readout (i.e., read_code(A)=01) in the first clock cycle and the first key unit of key B may be selected for readout (read_code(B)=01) in the second clock cycle of the same key selection processing cycle at 638 while no other keys are selected for readout. The second clock cycle would have been an NOP clock cycle if any of the aforementioned conditions were not met. Further at 638, the value of Sumkey=KeyLen(A)+KeyLen(B) may be determined as described above.

In the case where the key selection processing cycle may not be aligned at 636, key B may be selected for readout at 640 while other keys including key A may not be selected (i.e., read_code(other keys)=00).

Note that 642 indicates that key A may not sent in the same processing clock cycle of the first key unit B. This is due to the fact that the state is not aligned and a new key B may be starting on the second half of a processing cycle. If the state is aligned, then both B0 and A may be sent in the same processing cycle.

Since key B may include at least three key units, one key unit of key B may be selected for readout in the current key selection processing cycle and the remaining key units may be selected in the next key selection processing cycle (i.e., read_code(B)=10). After completing the readout of key B, no action may be taken for one clock cycle at 642, and then key A may be selected for readout (i.e., read_code(A)=01) while no other keys are selected (i.e., read_code(other keys)=00) at 644. Furthermore, determination of Sumkey=KeyLen(A)+ KeyLen(B) may be performed at 644 as described above.

Once 632, 638 or 644 are completed, the process moves to 646 in FIG. 6(*c*) where it may be determined whether the sumkey is even or not. When the sumkey is even, the process moves to 612 shown in FIG. 6(*a*). When the sumkey is odd, it may be determined whether the key selection processing cycle is aligned or not at 648. If the current processing cycle is aligned, the state of the current processing cycle may be changed to "not aligned" at 650. If the current processing cycle is not aligned, the state of the current processing cycle may be changed to "aligned" at 652. Upon completing changing the state of the key selection processing cycle at 650, 642, the process may move back to 612 in FIG. 6(*a*)

As explained, according to the principles disclosed herein, NOP clock cycles may be used for recycled key selection when predetermined conditions are met. Thus, the key selection optimization scheme may save NOP instructions. Considering that the time to process a NOP clock may be 2 ns and the total access time for a packet may be 30 ns, for a packet line rate of 1 Gbps, the key selection optimization scheme may process a TCAM at the rate of about 22.4 Gbps (1 Gbps×672 ns/30 ns=22.4 Gbps), which show about 16% improvement over the regular TCAM rate which is 18.66 Gbps. The process, of course, may improve rates accordingly for other packet line rates, clock times and access times.

In accordance with various embodiments of the disclosure, the methods described herein are intended for operation with dedicated hardware implementations including, but not limited to, semiconductors, application specific integrated circuits, programmable logic arrays, and other hardware devices constructed to implement the methods and modules described herein. Moreover, various embodiments of the disclosure described herein are intended for operation as software programs running on a computer processor. Furthermore, alternative software implementations including, but not limited to, distributed processing, component/object distributed processing, parallel processing, virtual machine processing, any future enhancements, or any future protocol can also be used to implement the methods described herein.

It should also be noted that the software implementations of the disclosure as described herein are optionally stored on a tangible storage medium, such as: a magnetic medium such as a disk or tape; a magneto-optical or optical medium such as a disk; or a solid state medium such as a memory card or other package that houses one or more read-only (non-volatile) memories, random access memories, or other re-writable (volatile) memories. A digital file attachment to email or other self-contained information archive or set of archives is considered a distribution medium equivalent to a tangible storage medium. Accordingly, the disclosure is considered to include a tangible storage medium or distribution medium, as listed herein and including art-recognized equivalents and successor media, in which the software implementations herein are stored.

While the disclosure has been described in terms of illustrative embodiments, those skilled in the art will recognize that the disclosure can be practiced with modifications in the spirit and scope of the appended claims. These examples given above are merely illustrative and are not meant to be an exhaustive list of all possible designs, embodiments, applications or modifications of the disclosure.

What is claimed is:

1. A method for optimizing generation of look-up keys for searching, comprising:
    generating a first look-up key from a group of look-up key units stored in a data storage, generation of the first look-up key being completed prior to the completion of a key generation processing cycle;
    skipping over a next look-up key unit from the group of look-up key units stored in the data storage when the next look up key unit corresponds to a second look-up key that has a key length equal to or smaller than a first predetermined key length;
    selecting a third look-up key unit from the group of look-up key units, the third look-up key unit being associated with a third look-up key having a key length greater than a second predetermined key length, the second predetermined key length being greater than the first predetermined key length; and
    outputting the first look-up key and at least a portion of the third look-up key sequentially during the same output processing cycle and subsequently outputting the second look-up key.

2. The method of claim 1, wherein the second predetermined key length is at least two times greater than the first predetermined key length.

3. The method of claim 2, wherein the second key is divided into at least three portions, each portion having a key length equal to or smaller than the first predetermined key length.

4. The method of claim 3, wherein the outputting comprises: outputting the first key and one of the at least three portions of the second key during the same key output processing cycle; and outputting a remaining portion of the second key in a subsequent key output processing cycle.

5. The method of claim 1, wherein a single key output processing cycle comprises two clock cycles.

6. The method of claim 5, wherein the outputting comprises: outputting the first key in a first clock cycle of the key output processing cycle; and outputting the portion of the second key in a second clock cycle of the key output processing cycle.

7. The method of claim 1, wherein the selecting a first key comprises: determining whether the key length of the first key is equal to or smaller than the first predetermined key length; and outputting the first key continuously during the key output processing cycle when the key length of the first key is greater than the first predetermined key length.

8. The method of claim 7, wherein the selecting a second key comprises: determining whether the key length of the second key is greater than the second predetermined key length; and outputting the first key during a subsequent output processing cycle when the key length of the second key is not greater than the second predetermined key length.

9. The method of claim 1, further comprises determining whether the key output processing cycle is aligned to a clock cycle.

10. The method of claim 9, further comprises: starting outputting of the second key continuously during the key output processing cycle when the key output processing cycle is not aligned; waiting for one clock cycle when the outputting of the second key is completed; and outputting another key after the waiting for one clock cycle.

11. A computer readable medium having a stored computer program embodying instructions, which, when executed by a computer, cause the computer to optimize generation of look-up keys for searching, the computer readable medium comprising:
    instructions for generating a first look-up key from a group of look-up key units stored in a data storage, generation of the first look-up key being completed prior to the completion of a key generation processing cycle;
    instructions for skipping over a next look-up key unit from the group of look-up key units stored in the data storage when the next look up key unit corresponds to a second look-up key that has a key length equal to or smaller than a first predetermined key length;
    instructions for selecting a third look-up key unit from the group of look-up key units, the third look-up key unit being associated with a third look-up key having a key length greater than a second predetermined key length, the second predetermined key length being greater than the first predetermined key length; and
    instructions for outputting the first look-up key and at least a portion of the third look-up key sequentially during the same output processing cycle and subsequently outputting the second look-up key.

12. The computer readable medium of claim 11, wherein the second predetermined key length is at least two times greater than the first predetermined key length.

13. The computer readable medium of claim 12, wherein the second key is divided into at least three portions, each portion having a key length equal to or smaller than the first predetermined key length.

14. The computer readable medium of claim 13, wherein the instructions for outputting comprises: instructions for outputting the first key and one of the at least three portions of the second key during the same key output processing cycle; and instructions for outputting a remaining portion of the second key in a subsequent key output processing cycle.

15. The computer readable medium of claim 11, wherein a single key output processing cycle comprises two clock cycles.

16. The computer readable medium of claim 15, wherein the instructions for outputting comprises: instructions for outputting the first key in a first clock cycle of the key output processing cycle; and instructions for outputting the portion of the second key in a second clock cycle of the key output processing cycle.

17. The computer readable medium of claim 11, wherein the instructions for selecting a first key comprises: instructions for determining whether the key length of the first key is equal to or smaller than the first predetermined key length; and instructions for outputting the first key continuously during the key output processing cycle when the key length of the first key is greater than the first predetermine key length.

18. The computer readable medium of claim 17, wherein the instructions for selecting a second key comprises: instructions for determining whether the key length of the second key is greater than the second predetermined key length; and instructions for outputting the first key during a subsequent key output processing cycle when the key length of the second key is not greater than the second predetermined key length.

19. The computer readable medium of claim 11, further comprises instructions for determining whether the key output processing cycle is aligned to a clock cycle.

20. The computer readable medium of claim 19, further comprises: instructions for starting outputting of the second key continuously during the key output processing cycle when the key output processing cycle is not aligned; instructions for waiting for one clock cycle when the outputting of the second key is completed; and instructions for outputting another key after the waiting for one clock cycle.

* * * * *